United States Patent [19]

Eggermont

[11] 4,204,177
[45] May 20, 1980

[54] NON-RECURSIVE DIGITAL FILTER WITH REDUCED OUTPUT SAMPLING FREQUENCY

[75] Inventor: Ludwig D. J. Eggermont, Eindhoven, Netherlands

[73] Assignee: U.S. Philips Corporation, New York, N.Y.

[21] Appl. No.: 767,549

[22] Filed: Feb. 10, 1977

Related U.S. Application Data

[63] Continuation of Ser. No. 631,384, Nov. 12, 1975, abandoned.

[30] Foreign Application Priority Data

Dec. 18, 1974 [NL] Netherlands ..................... 7416479

[51] Int. Cl.² ..................... H03H 7/28; H03K 5/156; G11C 19/00; G11C 21/00
[52] U.S. Cl. ............................ 333/166; 307/221 C; 333/173
[58] Field of Search ............... 333/70 T, 70 R, 165, 333/166, 173; 307/293, 221 R, 221 D, 221 C; 328/167; 357/24; 364/825–827, 862

[56] References Cited

U.S. PATENT DOCUMENTS

| | | | |
|---|---|---|---|
| 3,234,545 | 2/1966 | James et al. | 333/70 R X |
| 3,599,108 | 8/1971 | Gardner | 333/70 A |
| 3,613,030 | 10/1971 | Fjalibrant | 333/70 A |
| 3,622,916 | 12/1971 | Fjalibrant | 333/70 A |
| 3,904,965 | 9/1975 | Leuthold | 307/221 R |

*Primary Examiner*—Alfred E. Smith
*Assistant Examiner*—Marvin Nussbaum
*Attorney, Agent, or Firm*—Thomas A. Briody; Jack Oisher; James J. Cannon, Jr.

[57] ABSTRACT

Non-recursive digital filters having an output sampling frequency which is a factor of r lower than the input sampling frequency. A number of filters are described in which for each value of r and N (N being the number of filter coefficients) the time which is required to calculate an output sample is based on the output sampling period $T_u$. This is achieved by using a storage device in the input circuit.

10 Claims, 9 Drawing Figures

Fig.2
PRIOR ART $x(0) \rightarrow x(0) \quad x(-1) \quad x(-2) \quad x(-3) \quad x(-4) \quad \cdots \quad 0 \quad \cdots \quad$ $x(1) \rightarrow x(1) \quad x(0) \quad x(-1) \quad x(-2) \quad x(-3) \quad \cdots \quad 0 \quad \cdots \quad a(4)x(-4)+a(3)x(-3)+a(2)x(-2)+a(1)x(-1)+a(0)x(0) \rightarrow y(0)$ $x(2) \rightarrow x(2) \quad x(1) \quad x(0) \quad x(-1) \quad x(-2) \quad \cdots \quad 0 \quad \cdots \quad a(4)x(-3)+a(3)x(-2)+a(2)x(-1)+a(1)x(0)+a(0)x(1)$ $x(3) \rightarrow x(3) \quad x(2) \quad x(1) \quad x(0) \quad x(-1) \quad \cdots \quad 0 \quad \cdots \quad a(4)x(-2)+a(3)x(-1)+a(2)x(0)+a(1)x(1)+a(0)x(2) \rightarrow y(1)$ $x(4) \rightarrow x(4) \quad x(3) \quad x(2) \quad x(1) \quad x(0) \quad \cdots \quad 0 \quad \cdots \quad a(4)x(-1)+a(3)x(0)+a(2)x(1)+a(1)x(2)+a(0)x(3)$

I     II     III     IV

| I | IIA | | IIB | | | | | III | IV |
|---|---|---|---|---|---|---|---|---|---|
| x(0) → | x(0) 0 | x(-1) x(0) ⋮ 0 | x(2) x(-1) x(0) | x(3) x(2) x(-1) | x(-4) x(3) x(2) | x(-5) x(-4) x(-3) | x(-6) x(-5) x(-4) | a(4)x(-6)+a(3)x(-5)+a(2)x(-4)+a(1)x(-3)+a(0)x(-2) ⋮ 0 ⋮ | → y(-1) |
| x(1) → | ⋮ x(1) | | | | | | | | |
| x(2) → | x(2) 0 | x(1) x(2) ⋮ 0 | x(1) x(0) x(-1) | x(0) x(1) x(2) | x(-1) x(0) x(1) | x(-2) x(-1) x(0) | x(-3) x(-2) | a(4)x(-4)+a(3)x(-3)+a(2)x(-2)+a(1)x(-1)+a(0)x(0) ⋮ 0 ⋮ | → y(0) |
| x(3) → | ⋮ x(3) | | | | | | | | |
| x(4) → | x(4) 0 | x(3) x(4) ⋮ 0 | x(3) x(4) | x(2) x(3) | x(1) x(2) | x(0) x(1) | x(-1) x(0) | a(4)x(-2)+a(3)x(-1)+a(2)x(0)+a(1)x(1)+a(0)x(2) ⋮ 0 ⋮ | → y(1) |

NON-RECURSIVE DIGITAL FILTER WITH REDUCED OUTPUT SAMPLING FREQUENCY

This is a continuation of application Ser. No. 631,384, filed Nov. 12, 1975, now abandoned.

BACKGROUND OF THE INVENTION

1. Field to Which the Invention Relates

The invention relates to a non-recursive digital filter for generating digital-coded output samples which occur at a given output sampling frequency ($f_u$) and which are related in a predetermined way to a sequence of digital-coded input samples occurring at an input sampling frequency ($f_i$), the input sampling frequency being an integral multiple (r) of the output sampling frequency; comprising a first storage device arranged to store a given number of successive input samples; an input circuit for supplying successive input samples to said first storage device; a multiplier; means for supplying said input samples stored in said first storage device to said multiplier; means for supplying weight factors which correspond to the relationship between the input and output samples to said multiplier, said multiplier forming products of a given number (N) of said input samples and a number (N) of said weight factors; an adder coupled to said multiplier and arranged to supply, within one output sampling period ($1/f_u$), an output sample, which is given by the mathematical sum of the product formed within that period.

2. Description of Prior Art

Non-recursive digital filters of the type described above are known. For example, in a known filter r sets are formed for the calculation of an output sample in which each set consists of the sum of N products obtained by multiplying N input samples by N weight factors. Of said r sets one is read out to supply an output sample. For the calculation of one output sample rN additions and rN multiplications are performed in this filter in a period $T_u(=1/f_u)$ while due to the reduction of the sampling frequency, only N sums and products need to be determined.

In the Dutch Patent Application No. 7400761 a digital filter is described in which only N multiplications and N additions are performed in a period $T_u$ for calculating an output sample. Particularly in the embodiment of FIG. 7 of that application a non-recursive digital filter is used as first filter section comprising a time demultiplexer having r outputs, a buffer memory being connected to each output. The r buffer memories are read out at a frequency $f_u$ and the stored input samples are supplied to r multipliers for each forming a set of N/r products which supply an output sample after having been added up. The filter described here can be used to advantage when N/r is an integer; however, part of this advantage is lost when N/r is not an integer because the group of N weight factors must be completed to a multiple of r, which increases the number of multiplications and additions.

SHORT DESCRIPTION OF THE INVENTION

The invention has for its object to provide a universally applicable non-recursive digital filter of the type described above, in which the output sampling frequency is a factor r lower than the input sampling frequency and in which also only N products of input samples and weight factors need to be determined for calculating an output sample.

The filter according to the invention is therefore characterized in that said input circuit comprises a second storage device arranged to store a group of input samples, which group is formed by a given number of successive input samples, and means for writing said group of input samples into said first storage device in the rhythm of occurrence of the output samples.

SHORT DESCRIPTION OF THE FIGURES

The invention will be explained with reference to the figures in which

FIG. 2 and FIG. 3 show Tables associated with FIG. 1 to explain the operation of the filters described.

FIG. 5 shows a Table to explain the operation of the filter described in FIG. 4.

Figure 6:
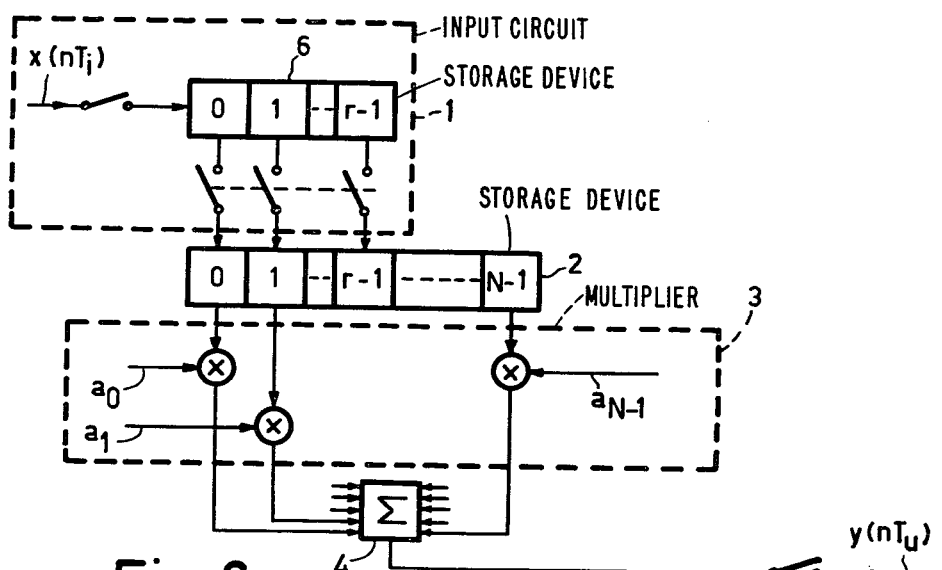
FIG. 6 shows a second embodiment of the filter according to the invention.
Figure 8:
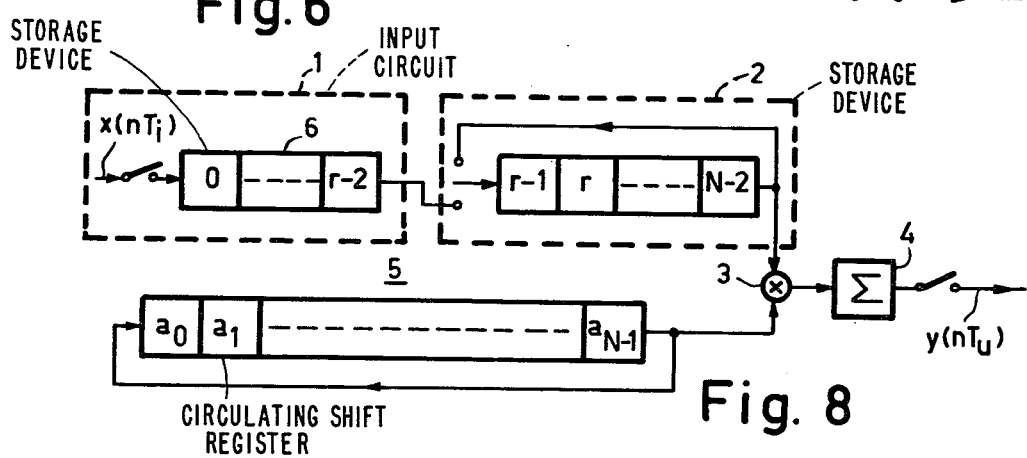
Figure 7:
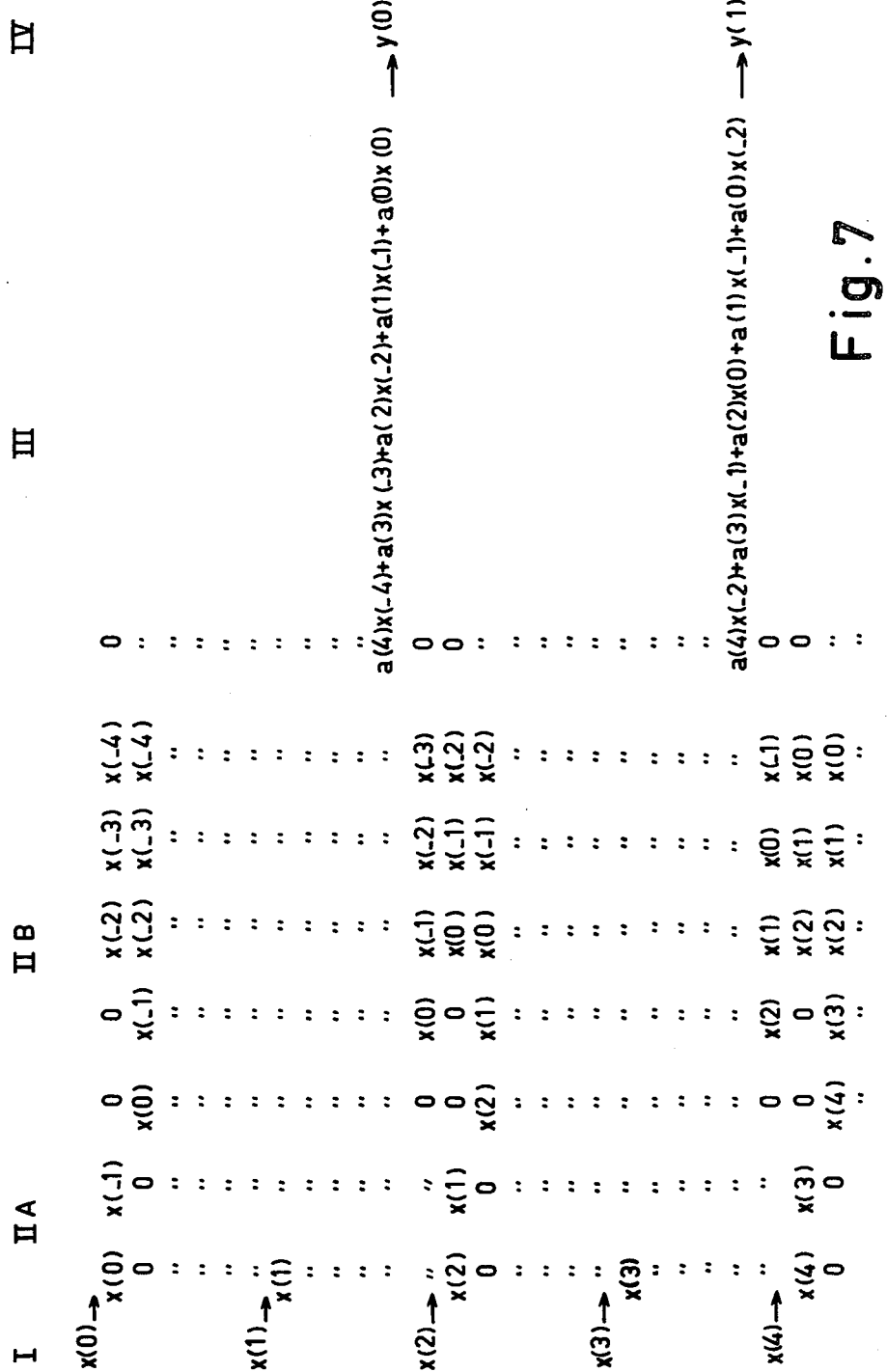

FIG. 7 explains, in the form of a Table, the operation of the filter according to FIG. 6, FIG. 8 shows a particularly favorable non-recursive digital filter according to the invention.

Figure 9:
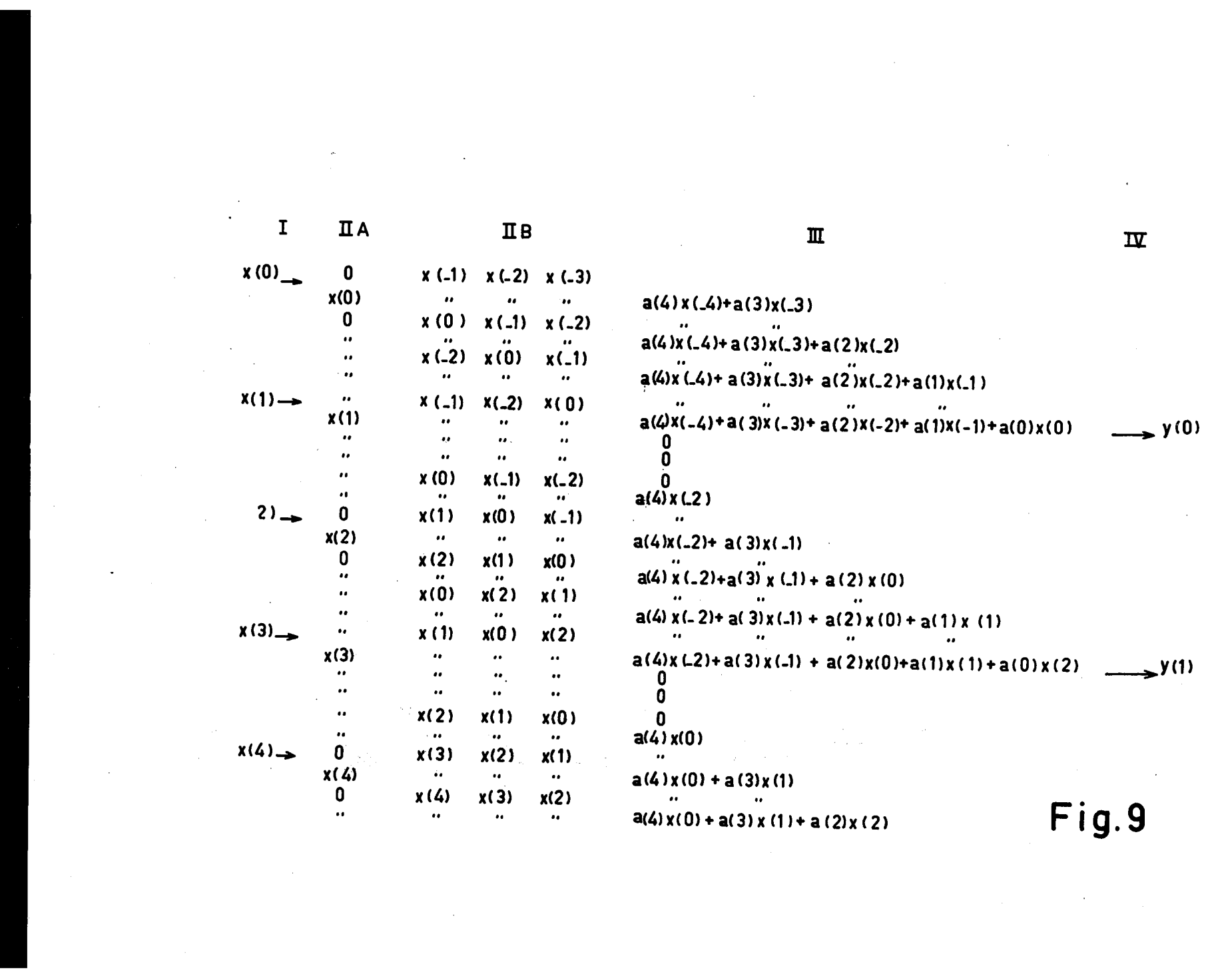

FIG. 9 shows a Table associated with FIG. 8. In the figures like elements are designated by the same reference figures.

DETAILED DESCRIPTION OF THE FIGURES

The non-recursive digital filters shown in the figures are arranged for generating digital-coded output samples which occur at a given output sampling frequency ($f_u$) and which are related in a predetermined way to a sequence of digital-coded input samples occurring at an input sampling frequency ($f_i$), the input sampling frequency being an integral multiple (r) of the output sampling frequency.

All embodiments of non-recursive digital filters shown in the figures are provided with a controller which controls, in the usual manner, the writing in, shifting and reading of samples as well as the operation of multipliers and adders. This controller which is obvious for one skilled in the art, is not shown in the figures.

Figure 1:
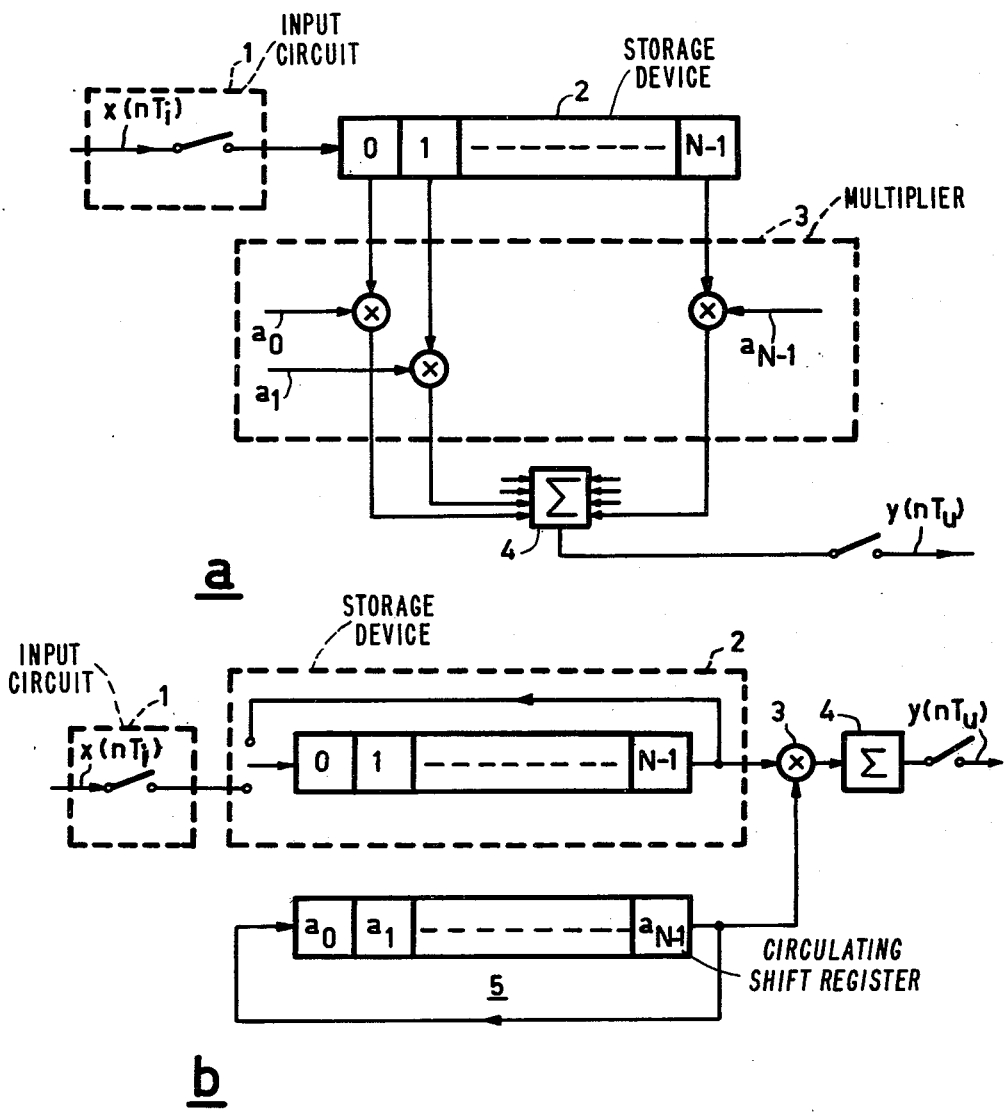
FIG. 1 shows two embodiments of a prior art non-recursive digital filter.

In FIG. 1a the input samples $x(nT_i)$ which occur with a period $T_i$ are written, via the input circuit 1, into the storage device 2, which comprises a delay line with N delay sections, each arranged to store an input sample. Each of these delay sections is connected to an adder 4 via a branch circuit which incorporated a multiplier, these multipliers forming together the multiplier device 3. To multiplier device 3 are also supplied the N weight factors a(o) . . . a(N−1) which are samples of the pulse response of the filter to be realized. The adder 4 forms the sum of the products of the N stored input samples and the N weight factors.

When via the input circuit 1 a new sample is written into the storage device 2, the stored input samples are shifted one place to the right, which causes the oldest sample to disappear. After adder 4 has been reset, the sum is formed of the products of the new sequence of N stored input samples and the N weight factors. An output sample is obtained by reading out the adder 4 with a perod $T_u = rT_i$.

FIG. 1b shows a filter which corresponds to FIG. 1a but in which the storage device 2 comprises a circulating shift register while the weighting factors a(o) . . . a(N−1) are also stored in a circulating shift register 5.

The multiplier device 3 comprises a single multiplier which determines, one after another, the N products of input samples and weight factors in an period $T_i$. An output sample is obtained by reading the adder 4 once in each output sampling period $T_u$.

Figure 3:
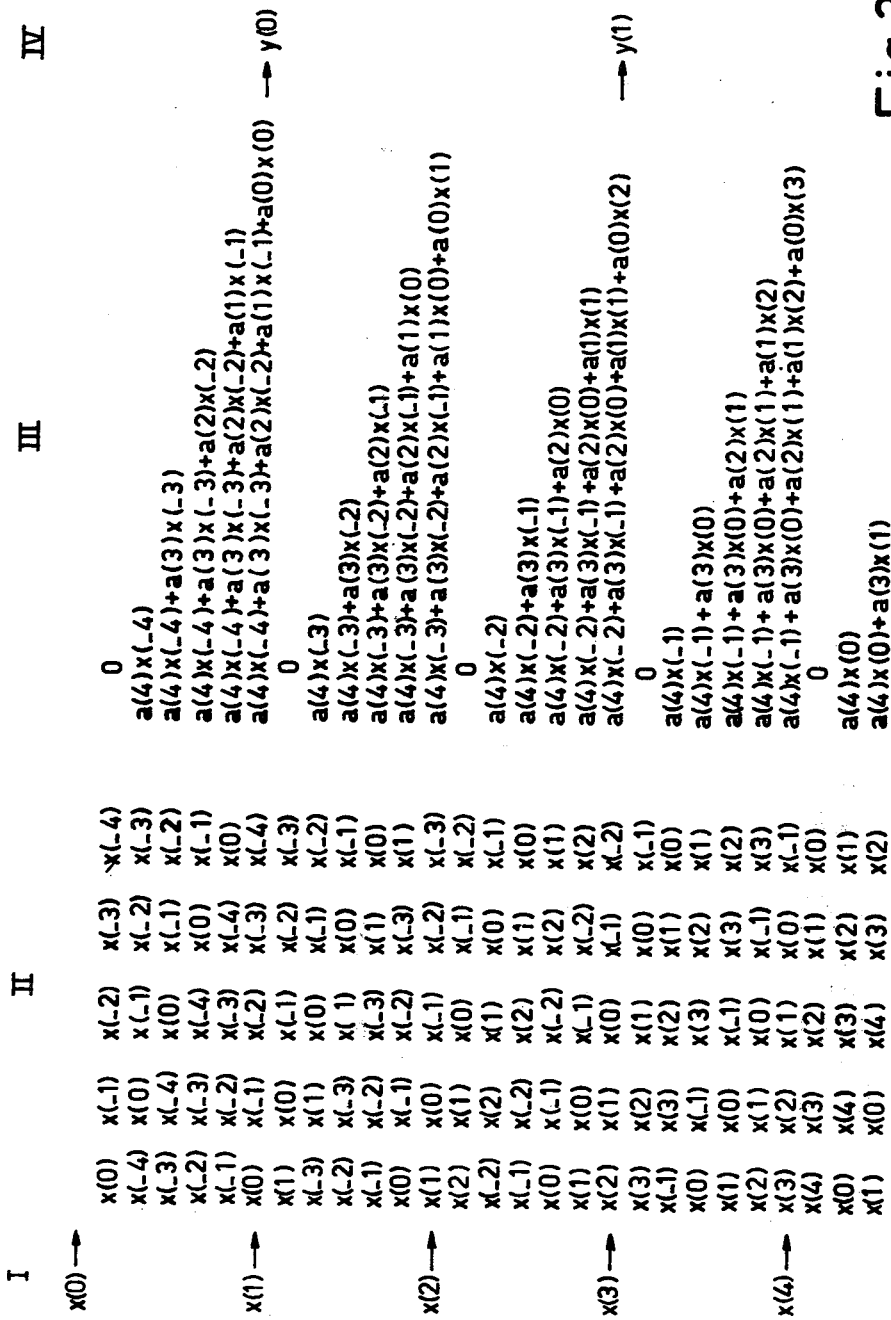

In FIGS. 2 and 3 the operation of the filters described in the FIGS. 1a and 1b respectively is illustrated in self-explanatory Tables. Column I shows the instant at which an input sample x(n) occurs, column II shows the content of storage device 2 at successive instants, column III shows the state of adder 4 and column IV shows the instant an output sample occurs.

By way of example, a reduction factor of the sampling frequency $r=2$ and a number of weight factors $N=5$ are chosen for the composition of the various Tables.

Figure 4:
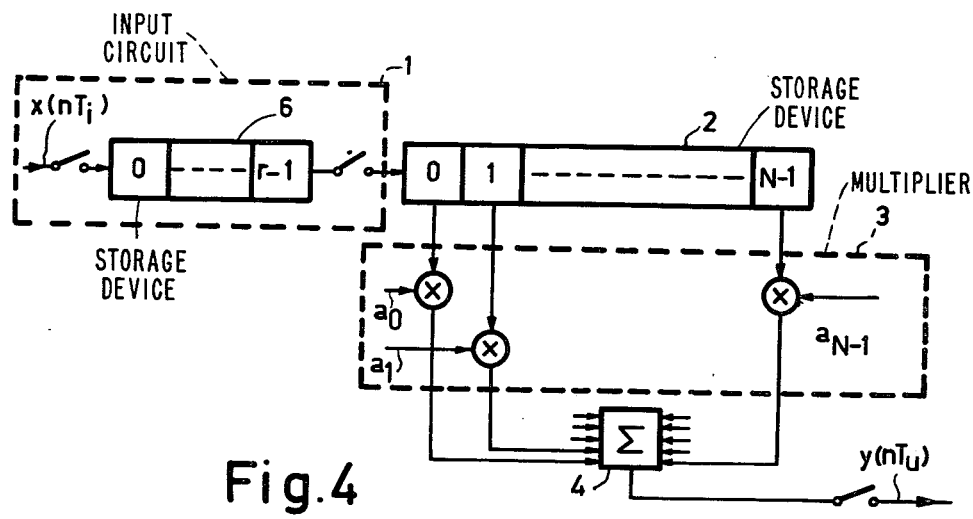
FIG. 4 shows a first embodiment of the filter according to the invention.

FIG. 4 shows an embodiment of the filter according to the invention in which the input samples $x(nT_i)$ which occur with a period $T_i$ are written into the storage device 6, which is incorporated in the input circuit 1. When a number r of new input samples have been written into the storage device 6, these samples are rapidly written, one after the other, into a storage device 2 while simultaneously the samples present in the storage device 2 shift r places and the oldest r samples disappear. A given weight factor from the group of weight factors a(o) ... a(N−1) is supplied to each of the multipliers in the multiplier device 3. For forming the N products in the multiplier device 3 which determine an output sample, a time $rT_i=T_u$ is available now, for the N stored input samples in a storage device 2 remain available until r new input samples have been written into the storage device 6. Once per output sampling period $T^u$ the adder 4 forms the sum of the calculated products and an output sample $y(nT_u)$ is supplied in this way.

FIG. 5 gives, in the form of a Table, a further explanation of the operation of the embodiment described in FIG. 4 in which the meaning of the columns I to IV is the same as in the FIGS. 2 and 3, except that here column II A represents the content of storage device 6 and column II B represents the content of storage device 2.

While in the embodiment shown in FIG. 4 the input samples are written into memory device 2 in time sequence, i.e. in series, in FIG. 6 the input samples stored in storage device 6 are written simultaneously into the first r storage elements of the storage device 2, each time an output sample has been calculated.

In the Table of FIG. 7 the operation of the embodiment according to FIG. 6 is illustrated. The columns I to IV have the aforementioned meanings and also in this case $N=5$ was chosen for the number of weight factors and $r=2$ was chosen for the ratio between the input and output sampling frequency.

It is to be noted that the invention is not limited to the embodiments shown in the FIGS. 4 and 6. The designated constructions, where use is made of a storage device 2 which comprises a delay line having N delay sections which are each connected to a multiplier of the multiplier device 3, can be replaced with equal advantage by a construction where a circulating shift register is used as storage device as shown above in FIG. 1b. In that case the multiplier device 3 then consists of a single multiplier which is connected to the output of the shift register. In that case the weight factors a(o) ... a(N−1) may also be stored in a circulating shift register or in a ROM. It is also possible to use a RAM as a storage device, the input samples $x(nT)_i$ which occur one after the other being written into the proper locations in the RAM by means of an address.

If in the example of FIG. 4 the storage device 2 is constructed as a circulating shift register a considerable reduction in the required number of elements can be obtained. FIG. 8 shows this particularly favorable embodiment of the non-recursive digital filter according to the invention. In this embodiment the storage device 2 comprises a circulating shift register which contains only N-r shift register sections. The number of sections of which storage device 6 is constructed depends on N. If, namely, N and r are such that $N \geq r^2-r$, the number of sections need only be $r-1$, while in the other case when $N < r^2-r$, storage device 6 consists of r sections.

In this construction according to FIG. 8, at the beginning of a calculation cycle in which an output sample is determined the oldest r input samples are not circulated in the shift register after they have multiplied by the correct weight factors, so that they are shifted from the register immediately one after the other while simultaneously the samples stored in storage device 6 are written into storage device 2. The shift register is not made circulating before the storage device 6 is empty.

FIG. 9 gives in the form of a Table a further explanation of the operation of the digital filter shown in FIG. 8, where $N=5$ and $r=2$ so that the condition $N \geq r^2-r$ is satisfied. In this case storage device 2 comprises a circulating shift register having $N-f=3$ sections and the number of sections of which storage device 6 consists is $r-1=1$. Column I represents the instant at which an input sample x(n) occurs, column II A represents the content of storage device 6 and column II B the content of storage device 2 at successive instants, column III represents the state of adder 4 and column IV the instant at which an output sample occurs.

It will be clear to those skilled in the art that on the basis of the described embodiments numerous other constructions of the non-recursive digital filter with reduced output sampling frequency can be realized in which the principle of the present invention is used.

What is claimed is:

1. A non-recursive digital filter for generating digital-coded output samples which occur at a given output sampling frequency ($f_u$) and which are related in a predetermined way to a sequence of digital-coded input samples occurring at an input sampling frequency ($f_i$), the input sampling frequency being a multiple (r) of the output sampling frequency comprising:

a first storage device arranged to store a given number of successive input samples;

an input circuit for supplying successive input samples to said first storage device;

a multiplier;

means for supplying said input samples stored in said first storage device to said multiplier;

means for supplying weight factors which correspond to the relationship between the input and output samples to said multiplier;

said multiplier forming sequentially a product of each of said N input samples and its corresponding weight factor;

an adder coupled to said multiplier and arranged to supply within one output sampling period (1/$f_u$), an output sample which is given by the mathematical sum of the products formed within that period;

said input circuit further comprising:

a second storage device arranged to store a group of input samples formed by a given number of successive input samples; and means for writing said group of input samples into said first storage device synchronously with the occurrence of the output samples, the rapid writing of said group of input samples into said first storage device being made possible by first writing the input samples of which the said group consists sequentially into said second storage device.

2. A non-recursive digital filter as claimed in claim 1, wherein all input samples of said group of input samples are written simultaneously in said first storage device.

3. A non-recursive digital filter as claimed in claim 1, wherein said first and second storage device each comprise:

a shift register, having a first and a second given number of shift register sections respectively;

each shift register section being arranged to store an input sample;

means to connect the output of said second storage device to the input of said first storage device;

means to interrupt said connection after each group stored in said second storage device has been written into said first storage device; and means to connect the output of the last section of said first storage device to the input of the first section thereof and to interrupt this connection for the period that the group stored in said second storage device is written into said first storage device.

4. The non-recursive digital filter of claim 1 wherein said first storage device is a circulating shift register having n-r shift register sections.

5. A non-recursive digital filter as claimed in claim 1, wherein all input samples of said group of input samples are written serially in said first storage device.

6. An improved non-recursive digital filter for generating digital coded output samples at an output sampling frequency ($F_u$) related in a predetermined way to a sequence of digital-coded samples at a frequency ($F_i$), the output sampling frequency being a factor r lower than the input sampling frequency and in which only n products of input samples and weight factors need be determined and n/r need not be an integral number, having a storage device arranged to store a given number of successive input samples; an input circuit for supply successive input samples to said first storage device; a multiplier; means for applying said input samples stored in said first storage device to said multiplier, said multiplier forming products of a given number n of said input samples and a number n of said weight factors by multiplying each input sample by its respective weight factor; an adder coupled to said multiplier and arranged to supply within one output sampling period ($1/f^u$) an output sample which is the mathematical sum of the products formed within that period, wherein the improvement comprises:

an input circit;

a second storage device within said input circuit arranged to store a group of input samples synchronously with the occurrence of said output samples;

means to transfer said input samples in said second storage device rapidly to said first storage device;

said second and first storage devices providing time for said multiplier device to complete its calculations.

7. The non-recursive digital filter of claim 6 wherein said means to transfer said input samples from said second storage device to said first storage device transfers said samples serially.

8. The non-recursive digital filter of claim 6 wherein said means to transfer said input samples from said second storage device to said first storage device transfers said samples in parallel.

9. The non-recursive digital filter of claim 6 wherein said first storage device is a delay line.

10. The non-recursive digital filter of claim 6 wherein said second storage device is a shift register having no more than r sections.

* * * * *